United States Patent
Keysar et al.

(10) Patent No.: US 9,698,299 B2
(45) Date of Patent: Jul. 4, 2017

(54) INTEGRATED CIRCUIT COMBINATION OF A TARGET INTEGRATED CIRCUIT AND A PLURALITY OF THIN FILM PHOTOVOLTAIC CELLS CONNECTED THERETO USING A CONDUCTIVE PATH

(71) Applicant: Sol Chip Ltd., Haifa (IL)

(72) Inventors: Shani Keysar, Haifa (IL); Reuven Holzer, Herzliya (IL); Ofer Navon, Pardes Hanna (IL); Ram Friedlander, Zichron Yaakov (IL)

(73) Assignee: Sol Chip Ltd., Haifa (IL)

( * ) Notice: Subject to any disclaimer, the term of this patent is extended or adjusted under 35 U.S.C. 154(b) by 0 days.

(21) Appl. No.: 14/580,692

(22) Filed: Dec. 23, 2014

(65) Prior Publication Data

US 2015/0111320 A1    Apr. 23, 2015

Related U.S. Application Data

(63) Continuation of application No. 13/329,571, filed on Dec. 19, 2011, now Pat. No. 8,921,967, which is a
(Continued)

(51) Int. Cl.
*H01L 21/00* (2006.01)
*H01L 31/18* (2006.01)
(Continued)

(52) U.S. Cl.
CPC .............. *H01L 31/18* (2013.01); *H01L 25/16* (2013.01); *H01L 25/50* (2013.01); *H01L 27/118* (2013.01);
(Continued)

(58) Field of Classification Search
CPC . H01L 2924/00014; H01L 2224/05552; H01L 25/167; H01L 31/03921;
(Continued)

(56) References Cited

U.S. PATENT DOCUMENTS 4,784,701 A    11/1988  Sakai et al.
5,155,565 A    10/1992  Wenz et al.
(Continued)

FOREIGN PATENT DOCUMENTS

JP    09312349    2/1997
JP    9312349     12/1997
WO    03079438    9/2003

OTHER PUBLICATIONS

International Search Authority: International Preliminary Report on Patentability (Chapter I of the Patent Cooperation Treaty) including "Written Opinion of the International Searching Authority" (PCT Rule 43bis. 1) for the corresponding International Patent Application No. PCT1IL20091000930; Date of Issuance: Mar. 29, 2011.
(Continued)

*Primary Examiner* — Duy T Nguyen
(74) *Attorney, Agent, or Firm* — M&B IP Analysts, LLC

(57) ABSTRACT

A device having a plurality of thin film photovoltaic cells (PV) formed over a passivation layer. The device comprises a plurality of thin film photovoltaic (PV) cells formed over the passivation layer, each PV cell includes at least a lower conducting layer (LCL) and an upper conducting layer (UCL); and a conducting path connecting at least a UCL of a first PV cell to at least a LCL of a second PV cell, wherein at least a first array of PV cells comprised of at least a first portion of the plurality of PV cells is connected by the respective UCL and LCL of each PV cell to provide a first voltage output. In an embodiment the passivation layer is formed over a target integrated circuit (TIC), the TIC having a top surface and a bottom surface.

17 Claims, 8 Drawing Sheets

Related U.S. Application Data continuation-in-part of application No. 13/270,869, filed on Oct. 11, 2011, now Pat. No. 8,952,473, which is a continuation-in-part of application No. 13/053,610, filed on Mar. 22, 2011, now Pat. No. 8,957,488, which is a continuation of application No. PCT/IL2009/000930, filed on Sep. 29, 2009.

(60) Provisional application No. 61/426,792, filed on Dec. 23, 2010, provisional application No. 61/391,905, filed on Oct. 11, 2010, provisional application No. 61/100,770, filed on Sep. 29, 2008.

(51) Int. Cl.

| | |
|---|---|
| H01L 25/16 | (2006.01) |
| H01L 27/118 | (2006.01) |
| H01L 27/142 | (2014.01) |
| H01L 31/0392 | (2006.01) |
| H01L 31/046 | (2014.01) |
| H01L 25/00 | (2006.01) |
| H01L 31/0465 | (2014.01) |
| H01L 23/00 | (2006.01) |

(52) U.S. Cl.
CPC ...... *H01L 27/11898* (2013.01); *H01L 27/142* (2013.01); *H01L 31/0392* (2013.01); *H01L 31/03921* (2013.01); *H01L 31/03923* (2013.01); *H01L 31/03925* (2013.01); *H01L 31/046* (2014.12); *H01L 31/0465* (2014.12); *H01L 24/05* (2013.01); *H01L 2224/05571* (2013.01); *H01L 2924/00014* (2013.01); *H01L 2924/10253* (2013.01); *H01L 2924/10271* (2013.01); *H01L 2924/10329* (2013.01); *H01L 2924/1305* (2013.01); *H01L 2924/13062* (2013.01); *H01L 2924/13063* (2013.01); *H01L 2924/14* (2013.01); *H01L 2924/1461* (2013.01); *Y02E 10/50* (2013.01)

(58) Field of Classification Search
CPC ........... H01L 2224/05571; H01L 24/05; H01L 25/16; H01L 27/118; H01L 27/11898; H01L 27/142; H01L 2924/10253; H01L 2924/10271; H01L 2924/14; H01L 25/50; H01L 31/0465; H01L 31/18
USPC .......................................................... 438/57
See application file for complete search history.

(56) References Cited

U.S. PATENT DOCUMENTS

| | | |
|---|---|---|
| 5,527,716 A | 6/1996 | Kusian et al. |
| 5,998,808 A | 12/1999 | Matsushita |
| 6,313,396 B1* | 11/2001 | Glenn .......................... 136/244 |
| 6,680,468 B1 | 1/2004 | Wang |
| 7,098,394 B2 | 8/2006 | Armer et al. |
| 7,196,391 B2 | 3/2007 | Hsieh |
| 7,675,158 B2 | 3/2010 | Kim et al. |
| 2002/0170591 A1 | 11/2002 | Armer et al. |
| 2002/0195136 A1 | 12/2002 | Takabayashi et al. |
| 2003/0152815 A1* | 8/2003 | LaFollette ........... H01M 2/0202 429/7 |
| 2004/0102022 A1* | 5/2004 | Jiang ................. H01L 21/76802 438/458 |
| 2004/0185667 A1* | 9/2004 | Jenson ................. A61N 1/3787 438/689 |
| 2004/0264225 A1 | 12/2004 | Bhavaraju et al. |
| 2005/0104747 A1 | 5/2005 | Silic et al. |
| 2005/0105224 A1 | 5/2005 | Nishi |
| 2005/0145274 A1 | 7/2005 | Polce et al. |
| 2006/0284302 A1 | 12/2006 | Kim et al. |
| 2007/0023919 A1* | 2/2007 | Lin .......................... H01L 24/12 257/774 |
| 2007/0079866 A1 | 4/2007 | Borden et al. |
| 2007/0087230 A1 | 4/2007 | Jenson et al. |
| 2008/0245400 A1 | 10/2008 | Li |
| 2008/0306700 A1 | 12/2008 | Kawam et al. |
| 2008/0314432 A1 | 12/2008 | Paulson et al. |
| 2009/0014049 A1 | 1/2009 | Gur et al. |
| 2009/0217965 A1 | 9/2009 | Dougal et al. |
| 2009/0250805 A1* | 10/2009 | Lohr ................... H01L 23/3677 257/706 |
| 2009/0288700 A1 | 11/2009 | Lifka et al. |
| 2010/0018565 A1 | 1/2010 | Funakoshi |
| 2010/0029074 A1* | 2/2010 | MacKay ................. H01L 24/03 438/613 |
| 2010/0126556 A1 | 5/2010 | Benitez et al. |
| 2010/0148293 A1 | 6/2010 | Jain et al. |
| 2010/0186804 A1 | 7/2010 | Cornfeld |
| 2011/0067327 A1 | 3/2011 | Eiffert et al. |
| 2011/0109259 A1 | 5/2011 | Choi et al. |
| 2011/0312286 A1 | 12/2011 | Lin et al. |
| 2012/0062036 A1 | 3/2012 | Rabinovici et al. |

OTHER PUBLICATIONS

International Search Authority: International Search Report for the corresponding International Patent Application PCT/IL2009/000930; Date of Completion: Feb. 10, 2010.

* cited by examiner

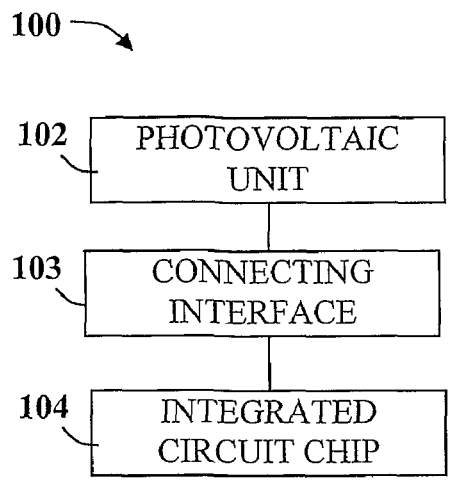
Fig. 1
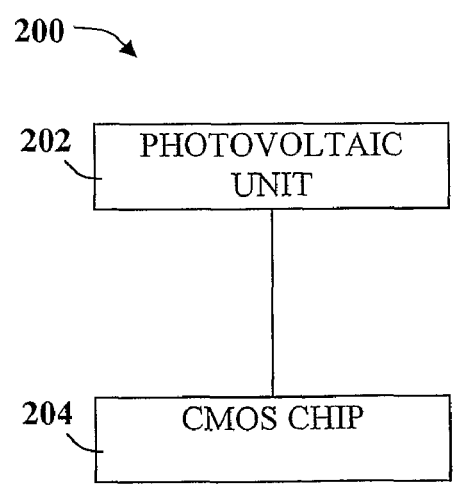 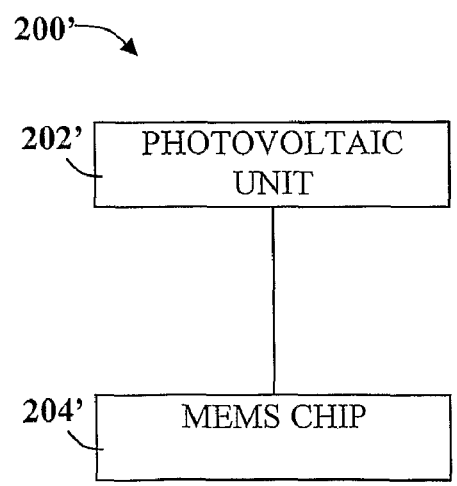
Fig. 2a  Fig. 2b

INTEGRATED CIRCUIT COMBINATION OF A TARGET INTEGRATED CIRCUIT AND A PLURALITY OF THIN FILM PHOTOVOLTAIC CELLS CONNECTED THERETO USING A CONDUCTIVE PATH

CROSS-REFERENCE TO RELATED APPLICATIONS

This application is a continuation application of U.S. patent application Ser. No. 13/329,571 filed on Dec. 19, 2011, now U.S. Pat. No. 8,921,967. The Ser. No. 13/329,571 Application claims the benefit of U.S. Provisional Patent Application No. 61/426,792, filed Dec. 23, 2010. The Ser. No. 13/329,571 Application is also a continuation-in-part of U.S. patent application Ser. No. 13/270,869, filed Oct. 11, 2011, now U.S. Pat. No. 8,952,473, which claims the benefit of U.S. Provisional Patent Application 61/391,905, filed Oct. 11, 2010. The Ser. No. 13/270,869 is a continuation-in-part of U.S. patent application Ser. No. 13/053,610 filed Mar. 22, 2011, now U.S. Pat. No. 8,957,488, which is a continuation of PCT Application No. PCT/IL/2009/000930, filed Sep. 29, 2009, which claims priority from U.S. Provisional Patent Application No. 61/100,770, filed Sep. 29, 2008. All the above-referenced applications are assigned to common assignee and are hereby incorporated by reference for all that they contain.

TECHNICAL FIELD

The invention generally relates to integrated circuit chips, and more particularly to adding a plurality of cell structures over a target integrated circuit (IC), and furthermore to the connection of photovoltaic cells for the purpose of generating a plurality of voltages and/or a plurality of current drive capabilities through the connection of the cell structures over the target IC.

BACKGROUND

Integration circuits (ICs) or chips designed using, for example, a very-large-scale integration (VLSI) process, typically draw power from external sources such as grid power (mains), batteries, or the like. Increasingly, however, devices utilizing such components demand greater levels of energy efficiency. This is largely due to the prevalence of wireless and mobile devices becoming more widespread.

Personal communication devices, such as mobile phones, smart phones, PDAs, handheld PCs, and the like, as well as many entertainment devices, such as media players, MP3, MP4, mobile DVD, digital cameras, and the like, as well as other household, office and leisure gadgets are commonly powered by batteries of electrochemical power cells. A drawback with battery-operated devices is that electrochemical power cells often run out of power at inconvenient times and therefore batteries need to be regularly recharged or replaced.

Such devices may be less dependent upon power provided by electrochemical power cells if some of their components were able to power themselves. Thus, the energy efficiency of mobile devices may be improved by a convenient and effective solar powered VLSI chip.

Furthermore, such solar powered components could be effectively used in applications where a power supply is unavailable. Self-powering components may therefore be utilized in a variety of stand-alone communication units, road signs for remote locations, in buoys, floats or other maritime applications.

Attempts have been made to connect VLSI chips to elements, such as photovoltaic cells (PVs), in order that they might draw solar power therefrom, and therefore the chips and photovoltaic cells are generally manufactured separately and later connected together using external wiring, gates, contacts or terminals.

For example, U.S. Pat. No. 6,680,468 to Wang, entitled, "Electrical-supply-free MOS integrated circuit", describes an electrical-supply-free MOS integrated circuit comprising: a semiconductor device having a current terminal, an input voltage terminal, and a common terminal. The voltage difference between the input voltage terminal, and the common terminal, controls current flow through the current terminal. An opto-electronic device is also provided to convert incident light into an electrical signal. In another example, PCT Application Publication No. WO/2003/079438 to Jaussaud, et al. entitled, "Multijunction Photovoltaic Device with Shadow-free Independent Cells and the Production Method Thereof", describes a multijunction photovoltaic device with independent cells. Contact pick-ups are provided on the front and/or rear face of the cells by means of metal wells, the sides of which are insulated from the semi-conducting layers.

Furthermore, US Patent Application Publication No. 2002/0170591 to Armer, et al., entitled "Method and apparatus for powering circuitry with on-chip solar cells within a common substrate", describes a light-powered transponder. In order to create sufficient voltage differential, two photovoltaic elements are used. The photovoltaic elements generate voltages of different polarities. Despite the inherent difficulties presented by the use of a standard Complementary metal-oxide-semiconductor (CMOS) process, Armer's system is directed towards achieving a voltage differential sufficient to power an ASIC by using photovoltaic elements independently to generate voltages with different polarities.

As mentioned all the above-described solutions require separate interconnecting conductors between their integrated circuits and their power sources. However, any additional components compromise the dimensions of the host devices and may also provide additional sources of failure.

FIG. 1 shows a schematic block diagram representing a conventional arrangement of a solar powered integrated circuit 100. It is noted that in order to use solar energy, devices are typically designed to include three separate components: an integrated circuit 104; a photovoltaic cell 102; and a connecting interface 103.

The integrated circuit (IC) 104 may be a miniaturized electronic circuit typically including semiconductor devices as well as passive components. ICs are generally manufactured upon the surface of a thin substrate of semiconductor material. Variously, integrated circuits 104 may be based upon, but not limited to, complementary metal-oxide-semiconductor (CMOS) chips, a micro-electro-mechanical systems (MEMS) chip, a very large scale integration (VLSI), or the like.

The photovoltaic cell 102 is configured to convert light into electricity typically using the photovoltaic effect. As the photovoltaic cell 102 is typically manufactured separately from the IC, it is necessary to provide the connecting interface 103.

The connecting interface 103 provides a conductive pathway, such as external wiring, gates, contacts, terminals, and the like, between the photovoltaic cell 102 and the integrated circuit 104. In addition, the connecting interface 103 may provide an intermediate external source layer of a power supply, such as an electrochemical cell, a capacitor or the like.

SUMMARY

Certain embodiments disclosed herein include an integrated circuit. The integrate circuit comprises a target integrated circuit (TIC) having a top surface and a bottom surface; and a plurality of thin film photovoltaic (PV) cells formed over at least one of the top surface and the bottom surface of the TIC, each of the plurality of PV cells includes at least a lower conducting layer (LCL) and an upper conducting layer (UCL), wherein the plurality of PV cells are arranged in a first array, two adjacent PV cells in each column of the first array are connected using a conducting path connecting at least a UCL of a first PV cell to a LCL of a second PV cell of the two adjacent PV cells, and wherein LCLs of PV cells in a lower row of the first array are connected to a ground line and UCLs of PV cells in the upper row of the first array of PV cells are connected together to provide a first voltage output.

Certain embodiments disclosed herein also include a manufacturing method of an integrated circuit combined with a target integrated circuit (TIC). The method comprises forming over at least one of a top surface and a bottom surface of the TIC a lower conductive layer (LCL) for a plurality of thin film photovoltaic (PV) cells; forming over the LCL the plurality of thin film photovoltaic (PV) cells; forming over each of the plurality of PV cells an upper conducting layer (UCL); and forming a conductive path connecting at least a UCL of a first PV cell of the plurality of PV cells to at least a LCL of a second PV cell of the plurality of PV cells, wherein at least a first array of PV cells comprised of at least a first portion of the plurality of PV cells is connected by the respective UCL and LCL of each PV cell to provide a first voltage output.

Certain embodiments disclosed herein also include an integrated circuit that comprises a target integrated circuit (TIC); a plurality of thin-film photovoltaic (PV) cells manufactured over at least one of a top surface and a bottom surface of the TIC, each PV cell of the plurality of PV cells having an upper connectivity layer (UCL) and a lower connectivity layer (LCL); a first group of a plurality of conducting paths connecting at least a first portion of the plurality of PV cells by their respective LCL and UCL to form a first array of PV cells providing a first voltage; and a second group of plurality of conducting paths connecting at least a second portion of the plurality of PV cells by their respective LCL and UCL to form a second array of PV cells, wherein LCLs of a group of PV cells in the first array are connected to UCLs of a group of PV cells in the second array to provide a second voltage.

Certain embodiments disclosed herein also include a device that comprises a passivation layer; a plurality of thin-film photovoltaic (PV) cells manufactured over the passivation layer, each PV cell of the plurality of PV cells having an upper connectivity layer (UCL) and a lower connectivity layer (LCL).

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiment will be apparent from the following detailed description taken in conjunction with the accompanying drawings.

FIG. 1 is a schematic block diagram representing a solar powered integrated circuit;

FIGS. 2a and 2b are schematic block diagrams representing two ASIC units according to exemplary embodiments of the integrated solar powered device;

DETAILED DESCRIPTION

Figure 3:
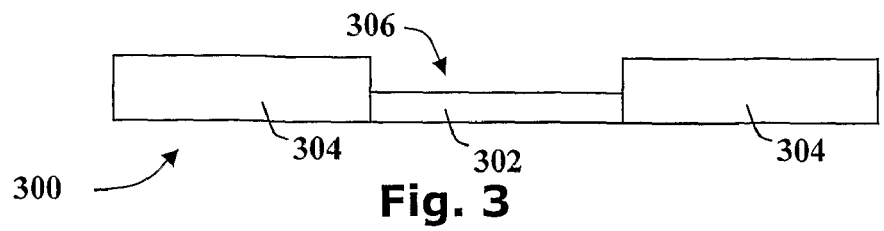
FIGS. 3 to 7 are schematic cross sections showing the stages of fabrication of an exemplary embodiment of the ASIC.

The embodiments disclosed herein are only examples of the many possible advantageous uses and implementations of the innovative teachings presented herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Certain exemplary embodiments include an integrated circuit (IC) combination of a target integrated circuit (TIC) having a top surface and a bottom surface and a plurality of thin film photovoltaic cells formed over at least one of the top surface and the bottom surface of the TIC. Each PV cell includes at least a lower conducting layer (LCL) and an upper conducting layer (UCL). The IC also includes a conducting path connecting at least a UCL of a first PV cell to at least a LCL of a second PV cell, wherein at least a first array of PV cells comprised of at least a first portion of the plurality of PV cells is connected by the respective UCL and LCL of each PV cell to provide a first voltage output. In another exemplary embodiment, the first array of PV cells is connected to a second array of PV cells to provide a second voltage output, the second voltage output being greater than the first voltage output in absolute terms.

To understand the disclosed various embodiments, particularly non-limiting embodiments related to cell structures that combine a TIC and a power cell that is created above or below the TIC, the power cell comprising at least one photovoltaic (PV) cell and processing thereof, are discussed herein below. The process of manufacturing the integrated circuit (IC) may be, but is not limited to, any micro-electro-mechanical systems (MEMS) process, standard complementary metal-oxide semiconductor (CMOS) processes, very large scale integration (VLSI), and the like as well as other suitable substrate materials.

FIGS. 2a and 2b schematically show block diagrams representing two embodiments of solar-powered application specific integrated circuit (ASIC) units. With particular reference to FIG. 2a, one embodiment of the solar powered ASIC 200 may include a photovoltaic cell 202 and a CMOS-type chip 204. In FIG. 2b, another embodiment of the solar powered ASIC 200' is shown including the photovoltaic cell 202' and a MEMS-type chip 204'. It should be appreciated by one skilled in the art that embodiments of the solar powered ASIC disclosed herein do not require connecting interfaces, such as the interface 103 shown in FIG. 1. It should be further appreciated that reducing the number of separate components is important in technologies, such as integrated circuits, where space saving is an important factor.

Self-powering ASIC units, such as embodiments of the solar powered ASICs 200, and 200' may be enabled by fabricating an integrated circuit (unit) upon p-type wafers, for example. P-type wafers are commonly used as substrate materials for both photovoltaic cells and semiconductor devices. Thus, a common p-type wafer substrate may be shared by the photovoltaic cell 202, 202' and the chip 204, 204', thereby reducing the total space requirements. According to certain exemplary embodiments, a photovoltaic cell layer may be fabricated over a VLSI device, and alternatively a photovoltaic cell may be fabricated onto one side of the substrate with the VLSI fabricated upon the reverse side. Various photovoltaic fabrication techniques may be used, including thin-film manufacturing and the like.

Thus, the photovoltaic cell 202, 202' and the chip circuit 204, 204' may be manufactured in one process or as one piece with no additional connecting interface. Hence, the solar-powered ASIC may be manufactured in one process, according to electrical and other rules for integration of the layers.

Possible methods for the fabrication of embodiments of self-powering ASIC units are described below with reference to FIGS. 3 to 8. Specifically, FIGS. 3 to 7 show schematic cross sections representing the main elements of the ASIC unit during various stages of its preparation. FIG. 8 is a flowchart showing the steps of a general method of manufacture.

FIG. 3 is a schematic cross section showing the main elements of an integrated circuit base wafer 300. The base wafer 300 may be prepared, for example, using a standard CMOS process. In particular, the integrated circuit base wafer 300 includes metal pads 302 and a passivation layer 304.

The passivation layer 304 partially covers the metal pads 302. However, the passivation layer 304 is interrupted by openings 306 which provide channels through which an electrical connection may be formed between the metal pads 302 and overlying layers or other components.

Figure 4:
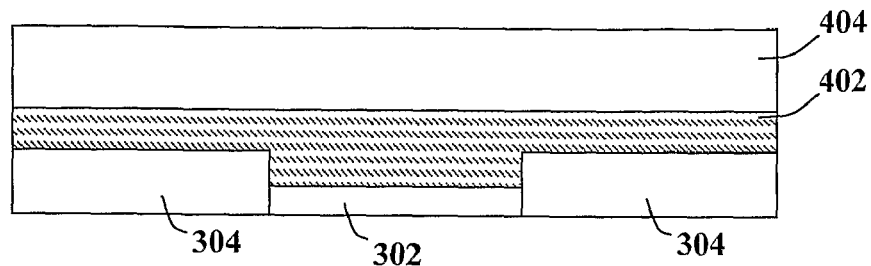

FIG. 4 is a schematic cross section showing the base wafer 300 of FIG. 3 over which photovoltaic enabling layers have been deposited. Two photovoltaic enabling layers are represented by a lower photovoltaic metal electrode layer 402 and a photovoltaic stack 404. Various materials, known in the art, may be used as photovoltaic stacks 404 of embodiments of the solar powered ASIC. For example, thin film photovoltaic stacks may use hydrogenated amorphous silicon (a-Si:H), microcrystalline silicon (μ-Si:H) photo cells, cadmium telluride (CdTe), copper indium gallium selenide (CIGS), or the like.

The lower photovoltaic metal electrode layer 402 provides conductive communication between the photovoltaic stack 404 and the metal pads 302 exposed by the openings in the passivation layer 304. Typically, the lower photovoltaic metal electrode layer 402 is a metal deposition layer such as aluminum for example, although any conducting layer may be used to suit requirements.

Figure 5:
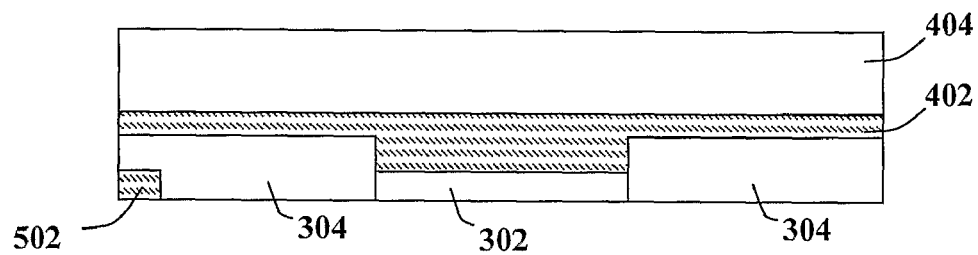

In FIG. 5, the cross section of the wafer of FIG. 4 is shown with an additional opening 502 exposing the metal pad 302 of the base wafer 300. The opening 502 may be used to provide a conductive channel connecting the metal pad 302 to the upper electrode 702 (see FIG. 7) of the photovoltaic cell 404. Typically, the opening 502 may be created using an ash etching process in which the photovoltaic stack 404 is etched to re-expose the metal pads 302 and possibly to expose new pads for connecting to the photovoltaic cell.

Figure 6:
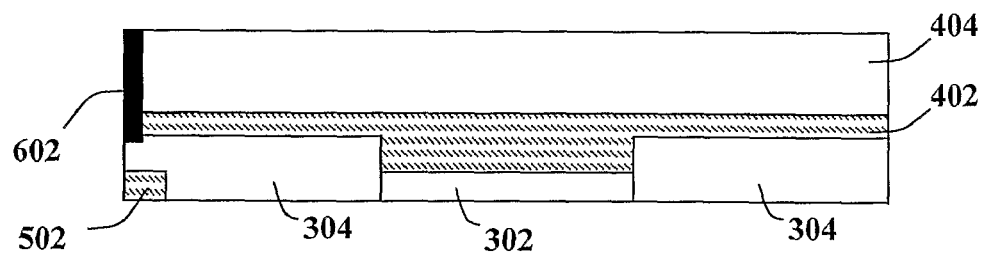

FIG. 6 shows a cross sectional view of the wafer of FIG. 5 including a separator 602. The separator 602 provides a film isolating the top electrode 702 (FIG. 7) and bottom electrodes 402 of the photovoltaic stack 404. The separator 602 may be formed by deposition of an isolating film such as silicon dioxide (SiO2), over the wafer, which may then be selectively etched back to re-expose. Typically, following the etching back process, spacers are located along the walls of the photovoltaic cell 404.

Figure 7:
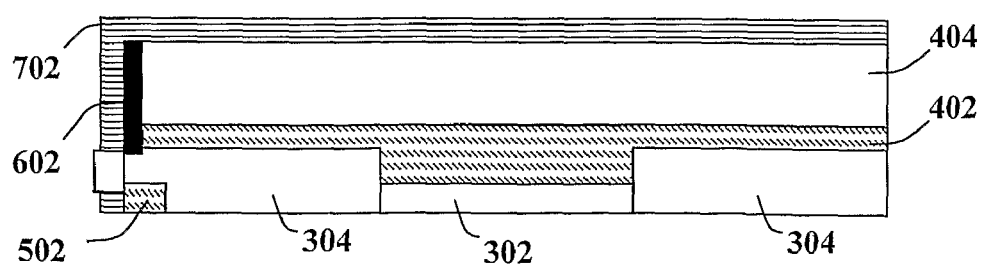
Figure 8:
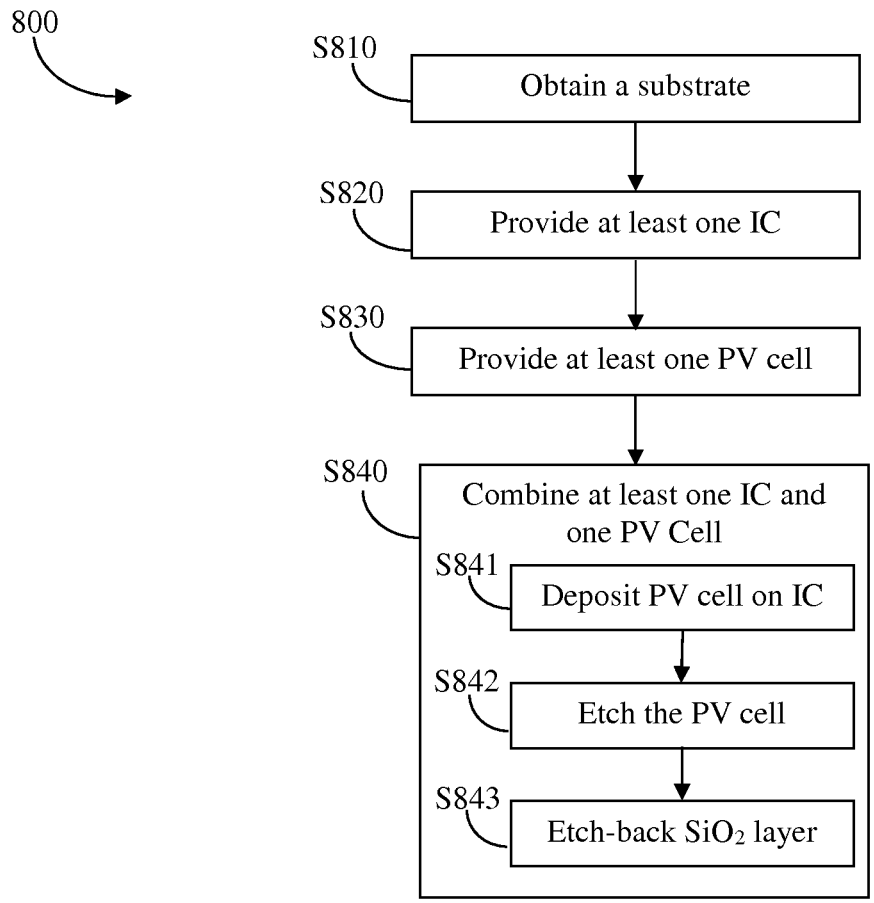
FIG. 8 is a flowchart illustrating a method for producing a self powering ASIC unit in accordance with an embodiment.

FIG. 7 shows a schematic cross section of the main elements of an embodiment of the solar powered ASIC following fabrication. A top electrode 702 has been provided for the photovoltaic stack 404. The top electrode 702 may be provided, for example, by depositing an aluminum layer over the photovoltaic stack 404 and in conductive communication with the base wafer via the opening 502 created during the etch process.

It is noted that the lower electrode 402 and the top electrode 702 may be prepared by the CMOS process that is used for the VLSI part of the integrated device, and therefore may vary from one process to the other.

It should be appreciated that the embodiments described above in relation to FIGS. 3 to 7 relate to an integrated circuit having an overlaid photovoltaic cell. In alternative embodiments, the integrated circuit and photovoltaic layers may be deposited upon reverse sides of a single substrate. Still other configurations will occur to one person of ordinary skill in the art.

FIG. 8 shows a non-limiting and exemplary flowchart 800 representing the steps of a method for producing a self-powering ASIC unit. The production method comprises obtaining a substrate (S810); providing at least one integrated circuit upon the substrate (S820); providing at least one photovoltaic cell upon the substrate (S830); and combining at least one integrated circuit and at least one photovoltaic cell (S840).

In S810, a substrate is obtained. Integrated circuits may be manufactured in the surface of a thin substrate, optionally made of semiconductor material. In S820, at least one integrated circuit may be provided upon the substrate. The integrated circuits may be, for example, and without limitation, any semiconductor die including, for example, CMOS, MEMS or other circuit. In S830, at least one photovoltaic cell may be provided upon the IC, i.e., above or below the TIC. A layer that comprises at least one photovoltaic cell may be added to the integrated circuit in order to produce the integrated ASIC.

In S840, the integrated circuit and the photovoltaic cell may be combined. In one embodiment, in order to combine the integrated circuit and the photovoltaic cell into an integrated ASIC, S840 includes: depositing the at least one photovoltaic cell on the integrated circuit (S841); etching the at least one photovoltaic cell (S842); and etching back a silicon dioxide layer (S843).

In S841, the photovoltaic (PV) cell is deposited. On top of the integrated circuit, a Photovoltaic Metal Electrode (BPVE) layer is deposited and on top of a BPVE layer, a thin film photovoltaic stack is placed.

In S842, the photovoltaic cell is etched. Strong acid or mordant is used to cut into the unprotected parts of a metal surface to create a design in the metal. The etching creates openings that re-expose parts of the integrated circuit and open new pads that are later to be connected to the top electrode of the photovoltaic cell.

In S843, a silicon dioxide (SiO2) layer is being etched back. A silicon dioxide layer is deposited over the ASIC unit and then etched back, providing an isolating film between the top and bottom photovoltaic electrodes.

Figure 9:
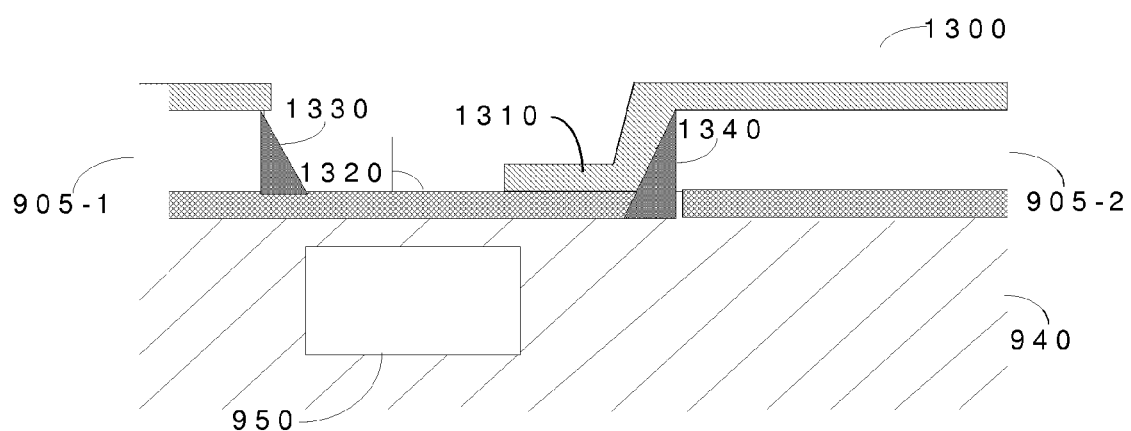
FIG. 9 is a schematic cross-section of a target integrated circuit connection on which a cell is integrated in accordance with the one embodiment.

FIG. 9 shows an exemplary and non-limiting schematic cross-section 900 of a TIC 940 on which a cell 905 is integrated in accordance with the certain embodiments. The cell 905 is comprised of the cell device 920, for example, but without limitation, a photovoltaic (PV) cell as has also been discussed hereinabove, each such cell having a LCL 930 below the cell device 920 and further having a UCL 910 above the cell device 920. The cell 905 is integrated over the surface 945 of the TIC 940, which may be, without limitation, any kind of semiconductor device having a particular function. The TIC 940 further comprises a top conducting layer (TCL) 950 that is used to electrically connect the cell 905 to the electrical routing of the TIC 940, as further described herein below.

Figure 10:
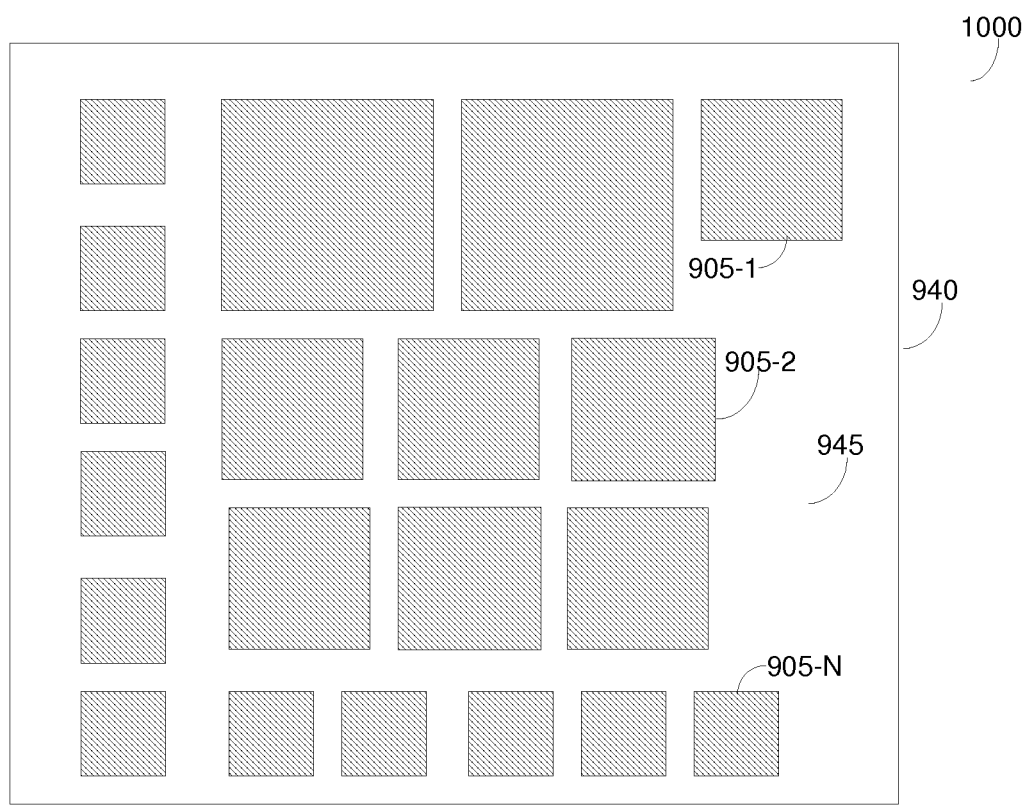
FIG. 10 is a top view of the target integrated circuit with a plurality of cells added on the top surface of the target integrated circuit.

FIG. 10 shows an exemplary and non-limiting top view 1000 of a TIC 940 with a plurality of cells 905-1 through 905-N added on the top surface 945 of the TIC 940. Each of the plurality of cells 905-1 to 905-N is, for example, but without limitation, a photovoltaic (PV) cell as has also been discussed hereinabove.

According to one embodiment, the plurality of cells 905-1 through 905-N may be the same kind of a cell. However, as also shown in FIG. 10, different cells 905 may be used, i.e., cell 905-1 may be different from cell 905-N. Accordingly, different cells 905 may be used, each having different sizes and/or different shapes. The cells 905 may cover the entire TIC 940 or portions thereof, and all are mounted over the surface 945 of the TIC 940. Each of the cells 905 has an UCL and a LCL.

Figure 11:
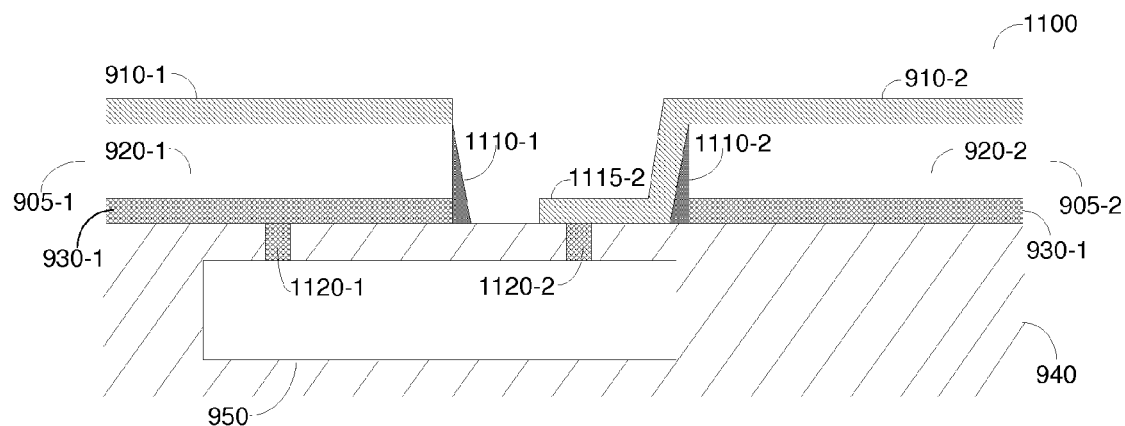
FIG. 11 is a schematic cross-section of two cells connected to the target integrated circuit

FIG. 11 shows an exemplary and non-limiting schematic cross-section 1100 of two cells 905 connected to the TIC 940 according to an embodiment. The two cells 905-1 and 905-2 are integrated over the TIC 940. The TIC 940 further comprises a TCL 950 to which, through a connector 1120-1, an electrical connection is made between the TCL 950 and the LCL 930-1 of cell 905-1. In addition, a connector 1120-2, also connected to the TCL 950, comprises a conductive path 1115-2 which is further connected to UCL 910-2. Hence, an electrical connection is now formed between a cell 905-1 and UCL 910-2 via LCL 930-1, connector 920-1, TCL 950, connector 920-2, and conductive path 1115-2. An isolation spacer 1110-2 is used to ensure that the conducting path 1115-2 does not make an unwanted connection to the cell device 920-2. The isolation spacer 1110-1 avoids unwanted connection to the LCL 930-1 of cell 905-1. The exemplary connection should not be understood as limiting upon the disclosed embodiments, and other connection options are possible that are consistent with the spirit of the disclosed embodiments.

Figure 12:
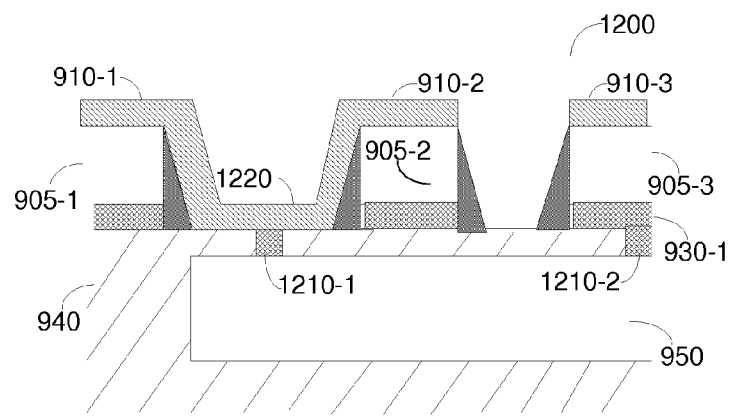
FIG. 12 is a schematic cross-section of three cells connected to the target integrated circuit.

FIG. 12 shows an exemplary and non-limiting schematic cross-section 1200 of three cells 905-1, 905-2, and 905-3 connected to the target integrated circuit 940 according to an embodiment. From the UCLs 910-1 and 910-2 a conducting path leads to a connector 1210-1 that connects both UCL 910-1 and 910-2 via the conductive path 1220 and the connector 1210-1 to the TCL 950 of TIC 940. The third cell 905-3 is connected to the TCL 950 of TIC 940 by means of a connector 1210-2 that provides electrical connectivity to the LCL 930-1 of cell 905-3. Thereby, the connectivity is achieved from the UCLs 910-1 and 910-2 of both cells 905-1 and 905-2 respectively to the LCL of cell 905-3 via TCL 950.

Figure 13:
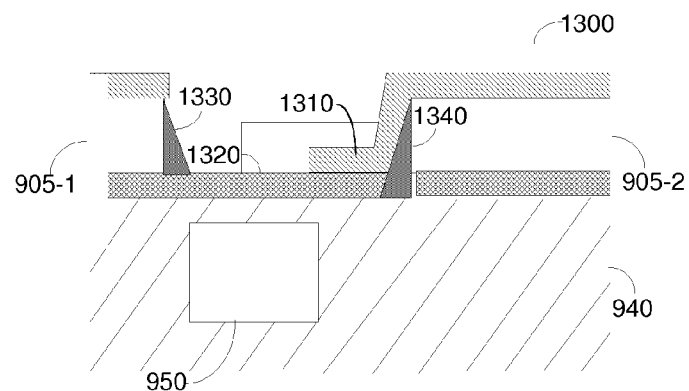
FIG. 13 is a schematic cross-section of two cells connected to each other from a lower conducting layer of a first cell to an upper conducting layer of a second cell.

The cross-section 1300 shown in FIG. 13 depicts two cells 905-1 and 905-2 connected to each other from the LCL of the first cell 905-1 to the UCL of the second cell 905-2. According to this embodiment, the LCL of the first cell 905-1 is extended beyond the cell 905-1 to form a conductive path 1320. The conductive path 1320 is connected to a conductive path 1310 that is further connected to the UCL of cell 905-2. According to this embodiment, a connection between the LCL of cell 905-1 and the UCL of cell 905-2 is achieved without a connection through the TCL 950 of the TIC 940. The isolation spacer 1330 is designed to allow the extension of the LCL of cell 905-1 to the conducting path 1310. An isolation spacer 1340 ensures that no conducting path is created between the conductive path 1310 and the LCL of cell 905-2.

Figure 14:
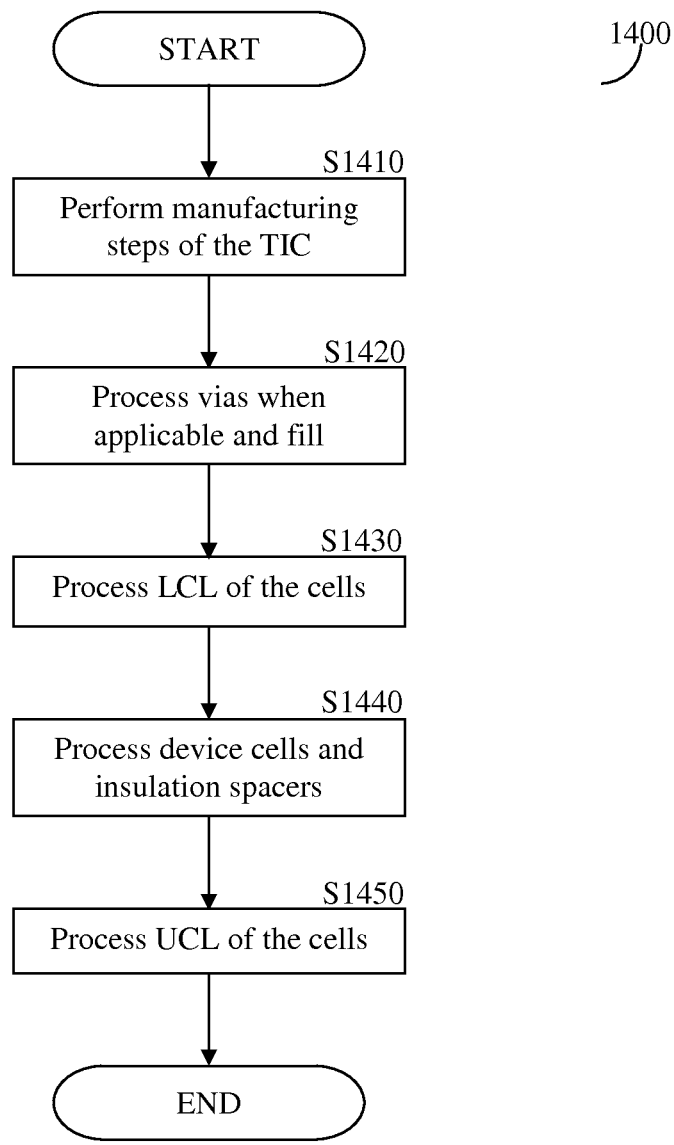
FIG. 14 is a flowchart describing a manufacturing method of an integrated circuit combined with a TIC.

FIG. 14 shows an exemplary and non-limiting flowchart 1400 of a manufacturing method 1400 of an integrated circuit combined with a TIC. In S1410, the processing steps for manufacturing the TIC are performed. This manufacturing process may be any fabrication technique known in the related art. It should be noted that this may vary from one integrated circuit to another depending on the specific manufacturing process used, the type of conductive layers, and so on and so forth. In S1420, if applicable, vias are created in the TIC to allow for the connectors, such as connector 1120, to be formed by filling them with a conducting material such as an appropriate metal. In S1430 the LCL of the cells 905 is formed. In S1440, the cells and, when applicable, insulating spacers are formed as may be appropriate. In S1450, the UCL is manufactured to complete the cells 905 manufacturing and connections thereto. It should be noted that the steps discussed herein are merely representative to a person of ordinary skill in the art who would readily be able to create the necessary steps that may vary depending on the type of cells 905 created, as well as other parameters thereof.

Figure 15:
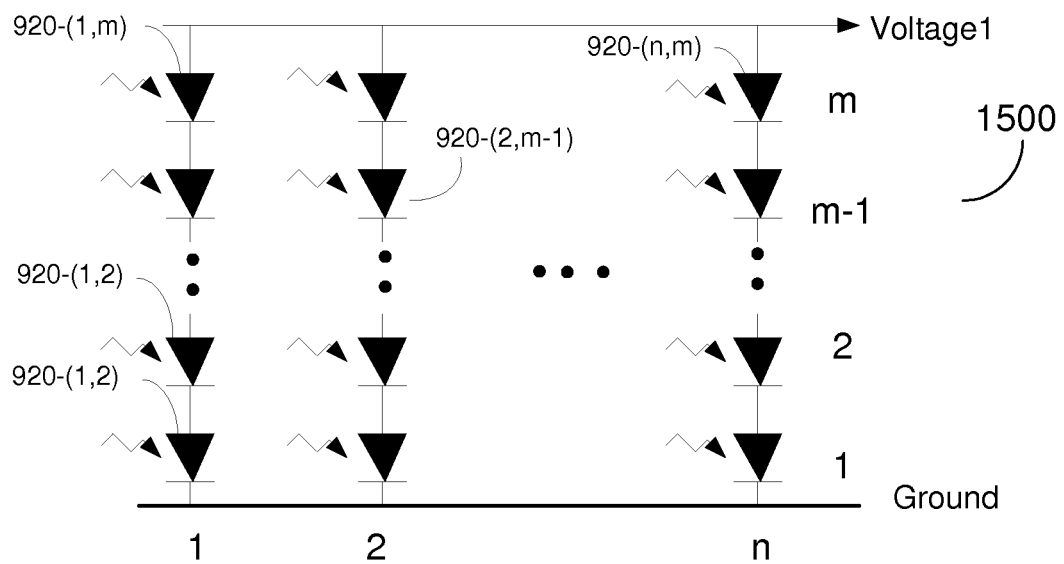
FIG. 15 shows a diagram of an electrical connection of an array of PV cells to provide a single voltage output according to one embodiment.
Figure 16:
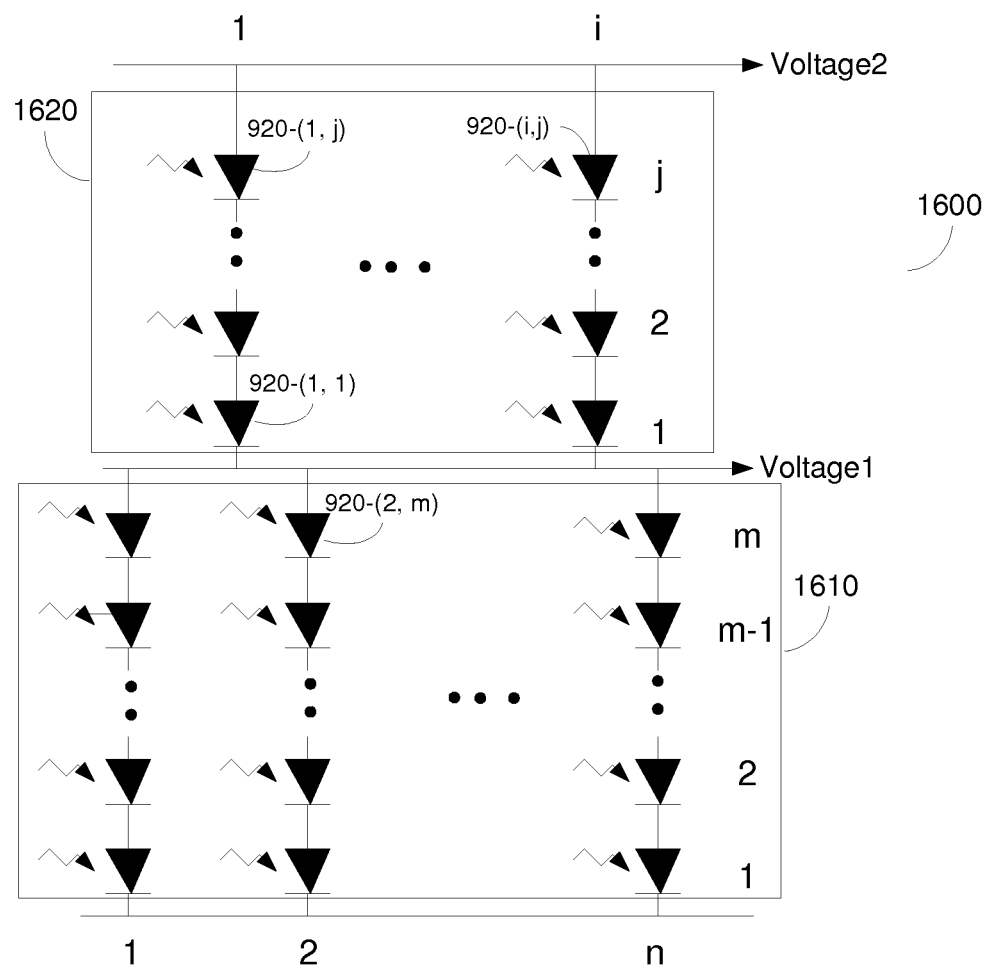
FIG. 16 shows a diagram of an electrical connection of an array of PV cells to provide a dual voltage output according to another embodiment.

The teachings described above can now be used with respect of the creation of various types of connections of PV cells, where the PV cells are the cells 920 described hereinabove in greater detail. The cells 920 are placed as a matrix of cells and connected to each other and to components of the TIC 940 as described herein below. Using the different connections allows for the generation of different voltages and different current supplies as may be necessary and supplies such connections by means of the UCL 910 and LCL 930 of the respective PV cells 920 to a desired component of the TIC 940. FIGS. 15 and 16 will be described with a reference to FIG. 9 where a cross-section of a target integrated circuit connection integrated with a PV cell is illustrated.

FIG. 15 shows an exemplary and non-limiting embodiment of PV cells 920 of an array 1500 of 'n' column by 'm' rows of PV cells. In one embodiment, each column connected such that the cathode of one PV cell is connected to the anode of the subsequent PV cell. The anode of each of the first PV cells in the series (e.g., PV cell 920-(1,m) to 920-(m–1)) provides a first voltage by means of, for example, its UCL 910. The last cathode of each cell in the series is connected to ground by means of, for example, the LCL 930 of the each PV cells in the last row (e.g., PV cells 920-(1,1) to 920-(n–1)). This is repeated for each of the columns '1' through 'n'.

In another embodiment, shown in the exemplary and non-limiting FIG. 16, the PV cells 920 are interconnected to allow for multiple voltage output. The first 'n' by 'm' array 1610 of PV cells provides a first voltage, while a second array 1620 of 'i' by 'm' PV cells provides a second voltage, the second voltage being a higher voltage than the voltage supplied by the first array. In the case where 'i'>'j', the current drive capability of the higher voltage is limited by the other part. The connectivity scheme, in accordance with one embodiment, is as described below, assuming the anodes are connected from the UCL 910 and the cathodes are connected by the LCL 930.

Specifically, the connectivity of PV cells in the 'n' by 'm' array 1610 is as described with respect of the arrangement in FIG. 15. The connectivity of the PV cells in the 'i' by 'j' array 1620 is such that the LCL 930 of the cathode of the first diode in a column (e.g., diode 920-(1,1) of the array 1620) is connected using the LCL 930 to the UCL 910 of the anodes of PV cells in the 'n' by 'm' array 1620.

The anode of each PV cell the upper row of the PV cells in f 'i' by 'j' array 1620 is connected to its respective UCL 910 and to a UCL 910 of its adjacent PV cell in the last row of cell in the array 1620 for outputting the second voltage. For example, the anode of a PV cell 920-(1,j) is connected to its UCL 910. The anodes of PV cells 920-(1,j) to 920-(i,j) are connected through their UCLs.

Therefore, in the arrangement illustrated in FIG. 16, two voltages are output relative to ground, the first voltage being a lower voltage, in absolute terms, and the second voltage being a higher voltage, in absolute terms. Therefore, the arrangement of PV cells shown in FIG. 16 can power one or more devices that are powered by different voltage levels. While two voltage levels are shown, a plurality of such levels may be devised to provide additional voltages as may be necessary for the purposes of the TIC 940.

In an embodiment, a TIC 940 may be combined with a plurality of PV cells 920 as explained in more detail hereinabove. A first group of PV cells 920 is connected, for example, to provide one or more voltages to a first portion of the TIC 940. A second group of PV cells 920 is connected, for example, to provide one or more voltages to a second portion of the TIC 940, such that the second group is independent from the first group. In one embodiment, the first group and the second group have a common ground connection.

The embodiments disclosed are only examples of the many possible advantageous uses and implementations of the innovative teachings presented herein. Particularly, it should be noted that while specific examples are provided with respect of PV cells, the scope of the disclosed embodiments should not be viewed as limited to such PV cells. Other cells having the general structure discussed at least with respect to FIG. 9 are specifically included. Moreover, the disclosed embodiments are not restricted for use in CMOS, MEMS and Silicon technologies and may be equally implemented in other technologies such as, but not limited to, GaAs and SiGe technologies. The devices may also include devices, such as a junction gate field-effect transistor (JFET), a metal semiconductor field effect transistor (MESFET), BiPolar, and others and any combinations thereof.

In general, statements made in the specification of the present application do not necessarily limit any of the various claimed disclosed embodiments. Furthermore, while the drawings show embodiments where the PV cells are created above the TIC, the invention also includes, without limitation, the creation of the PV cells on the bottom side of the TIC.

While the present disclosed embodiments has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the disclosed embodiments. Furthermore, the foregoing detailed description has set forth a few of the many forms that the disclosed embodiments can take. It is intended that the foregoing detailed description be understood as an illustration of selected forms that the disclosed embodiments can take and not as a limitation to the definition of the disclosed embodiments.

What is claimed is:

1. A method of manufacturing of a plurality of thin film photovoltaic (PV) cells on top of a passivation layer, the passivation layer being formed on top of a target integrated circuit formed in turn on top of a substrate, the passivation layer having a surface that is proximal to the target integrated circuit, comprising:
   forming on a surface of the passivation layer that is distal to the substrate, a lower conductive layer (LCL) for each PV cell of the plurality of the thin film PV cells;
   forming on a surface of the LCL that is distal to the substrate the plurality of thin film PV cells; and
   forming on each of the plurality of PV cells distal to the substrate an upper conducting layer (UCL) for each PV cell of the plurality of the thin film PV cells.

2. The method of claim 1, further comprising:
   forming a conductive path connecting at least a UCL of a first PV cell of the plurality of PV cells to at least a LCL of a second PV cell of the plurality of PV cells, wherein at least a first array of PV cells comprised of at least a first portion of the plurality of PV cells is connected by the respective UCL and LCL of each PV cell to provide a first voltage output.

3. The method of claim 1, further comprising:
   forming a connector through the passivation layer; and
   forming an electrical connection between at least one of the LCLs or the UCLs to any one of: a LCL, wherein the electrical connection is formed below the passivation layer and a UCL, wherein the electrical connection is formed below the passivation layer.

4. The method of claim 1, wherein the at least first array of PV cells is connected to at least a second array of PV cells to provide a second voltage output, the second voltage output being greater than the first voltage output in absolute terms.

5. The method of claim 4, wherein the at least second array of PV cells is comprised of at least a second portion of the plurality of PV cells and is connected by the respective UCL and LCL of each PV cell to provide a third voltage output.

6. The method of claim 5, wherein the at least second array of PV cells is connected to provide a fourth voltage output, the fourth voltage output being greater than the third voltage output in absolute terms.

7. The method of claim 4, wherein the at least first array of PV cells and the at least second array of PV cells have a common ground through a connection by one of the UCL and LCL.

8. The method of claim 1, wherein
the substrate is made of at least one of: Silicon, Gallium Arsenide (GaAs), or Silicon-Germanium (SiGe).

9. A method of manufacturing an integrated circuit combined with a target integrated circuit (TIC), comprising:
forming on at least one of a top surface and a bottom surface of the TIC a lower conductive layer (LCL) for a plurality of thin film photovoltaic (PV) cells;
forming the plurality of thin film photovoltaic (PV) cells on a surface of the LCL that is distal to a substrate of the TIC;
forming on each of the plurality of PV cells distal to the substrate an upper conducting layer (UCL); and
forming a conductive path connecting at least a UCL of a first PV cell of the plurality of PV cells to at least a LCL of a second PV cell of the plurality of PV cells, wherein at least a first array of PV cells comprised of at least a first portion of the plurality of PV cells is connected by the respective UCL and LCL of each PV cell to provide a first voltage output.

10. The method of claim 9, further comprising:
forming a connector to connect any one of a LCL and a UCL to a top conducting layer (TCL) of the TIC.

11. The method of claim 9, wherein the at least first array of PV cells is connected to at least a second array of PV cells to provide a second voltage output, the second voltage output being greater than the first voltage output in absolute terms.

12. The method of claim 11, wherein the at least second array of PV cells is comprised of at least a second portion of the plurality of PV cells and is connected by the respective UCL and LCL of each PV cell to provide a third voltage output.

13. The method of claim 12, wherein the at least second array of PV cells is connected to provide a fourth voltage output, the fourth voltage output being greater than the third voltage output in absolute terms.

14. The method of claim 12, wherein the at least first array of PV cells and the at least second array of PV cells have a common ground through a connection by one of the UCL and LCL.

15. The method of claim 9, wherein manufacturing the TIC is performed using at least one of: a MOS process, a CMOS process, a JFET process, a MESFET process, a BiPolar process, and a MEMS process.

16. The method of claim 9, wherein the substrate of the TIC is one of: Silicon, Gallium Arsenide (GaAs), and Silicon-Germanium (SiGe).

17. The method of claim 9, further comprising:
forming a passivation layer between the at least one of the top surface and the bottom surface of the TIC on which the LCL is formed and the LCL.

* * * * *